United States Patent [19]
Sgrignoli

[11] Patent Number: 5,668,498
[45] Date of Patent: Sep. 16, 1997

[54] CONTROLLING FPLL POLARITY USING PILOT SIGNAL AND POLARITY INVERTER

[75] Inventor: Gary J. Sgrignoli, Mt. Prospect, Ill.

[73] Assignee: Zenith Electronics Corporation, Glenview, Ill.

[21] Appl. No.: 645,175

[22] Filed: May 13, 1996

[51] Int. Cl.$^6$ .............. H03D 1/00; H03L 7/087; H04L 27/06
[52] U.S. Cl. .............. 329/360; 329/308; 329/325; 331/12; 455/204; 455/337; 375/321; 375/376
[58] Field of Search .............. 329/307–309, 329/325, 326, 360; 331/11, 12, 20; 348/735; 455/70, 182.2, 208, 260, 337, 204; 375/321, 376

[56] References Cited

U.S. PATENT DOCUMENTS

| | | | |
|---|---|---|---|
| 4,072,909 | 2/1978 | Citta | 331/12 |
| 4,091,410 | 5/1978 | Citta | 329/360 X |
| 4,541,118 | 9/1985 | Eastmond et al. | 455/70 X |
| 5,077,542 | 12/1991 | Lanoiselee | 455/70 X |

*Primary Examiner*—David Mis

[57] ABSTRACT

A biphase stable FPLL includes a polarity determination circuit that ascertains the lockup phase of the FPLL based upon the polarity of the pilot in the digital signal. A frequency lock circuit also determines from the recovered pilot when frequency lock has occurred and the polarity determination circuit is responsive thereto for inverting the phase of the incoming, or alternatively, of the outgoing signal, as determined in order to supply an output signal of predetermined polarity.

14 Claims, 3 Drawing Sheets

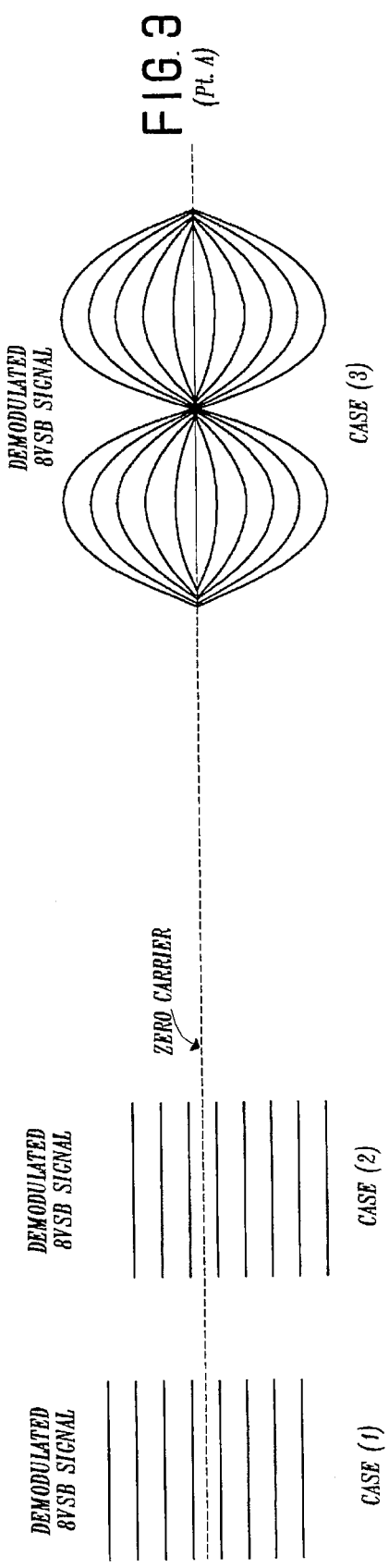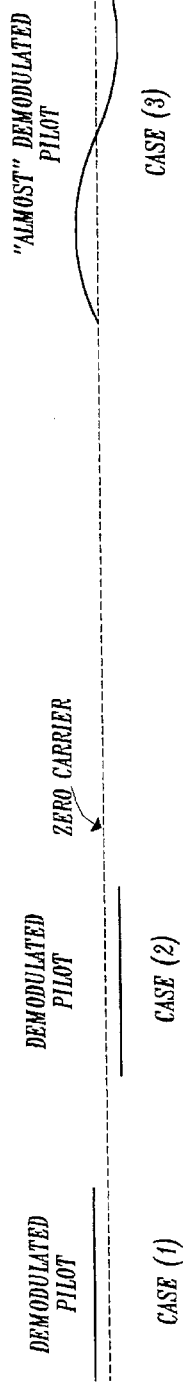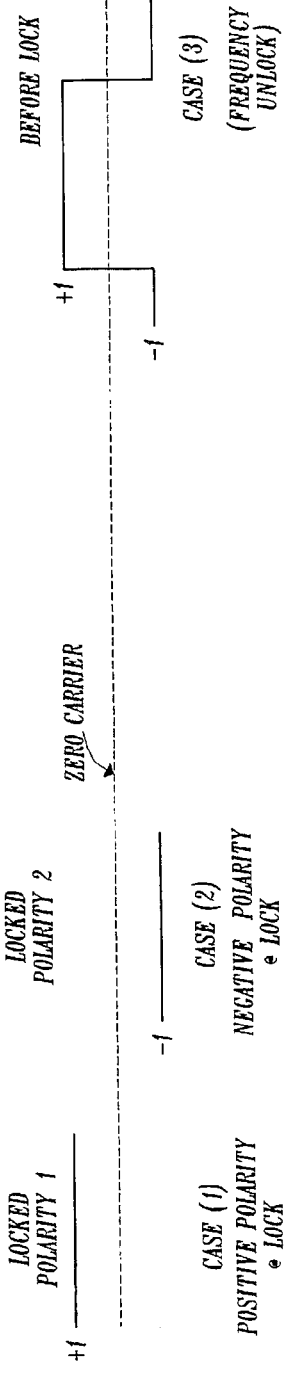

CONTROLLING FPLL POLARITY USING PILOT SIGNAL AND POLARITY INVERTER

BACKGROUND OF THE INVENTION AND PRIOR ART

This invention relates generally to demodulation systems and particularly to a demodulation system incorporating an FPLL (frequency and phase locked loop) for demodulating a digital signal.

FPLL demodulation circuits have been in common usage for a number of years and are fully described in U.S. Pat. Nos. 4,072,909 and 4,091,410, both of which are assigned to the assignee of this application and both of which are incorporated by reference herein. FPLLs are biphase stable and as such generally require some mechanism for assuring the proper polarity of demodulated output signal when, for example, they are used in television receiver circuits and the like. In the prior art circuits, an information signal (e.g. a data signal) was developed from the output of the limiter, which included a known component that indicated the lockup phase or polarity of the FPLL. This component was used to control an inverter for selectively inverting the FPLL output signal to assure a particular polarity.

The transmitted digital signal used with the invention includes a small in-phase pilot for enabling acquisition of the signal in the receiver. The pilot is provided in the data signal prior to modulation in the form of a DC offset voltage, and when demodulated in the receiver produces a corresponding DC voltage. The invention utilizes this DC voltage to determine the lockup polarity of the FPLL in the receiver and to correct the demodulated output signal polarity, if required.

OBJECTS OF THE INVENTION

A principal object of the invention is to provide a novel FPLL system for a digital signal having a pilot.

Another object of the invention is to provide an improved demodulator for a digital signal having a pilot.

BRIEF DESCRIPTION OF THE DRAWINGS

These and other objects and advantages of the invention will be apparent upon reading the following description in conjunction with the drawings, in which:

FIGS. 3, 4 and 5 are waveforms shown at indicated points on the block diagram of FIG. 2.

DESCRIPTION OF THE PREFERRED EMBODIMENT

Figure 1:
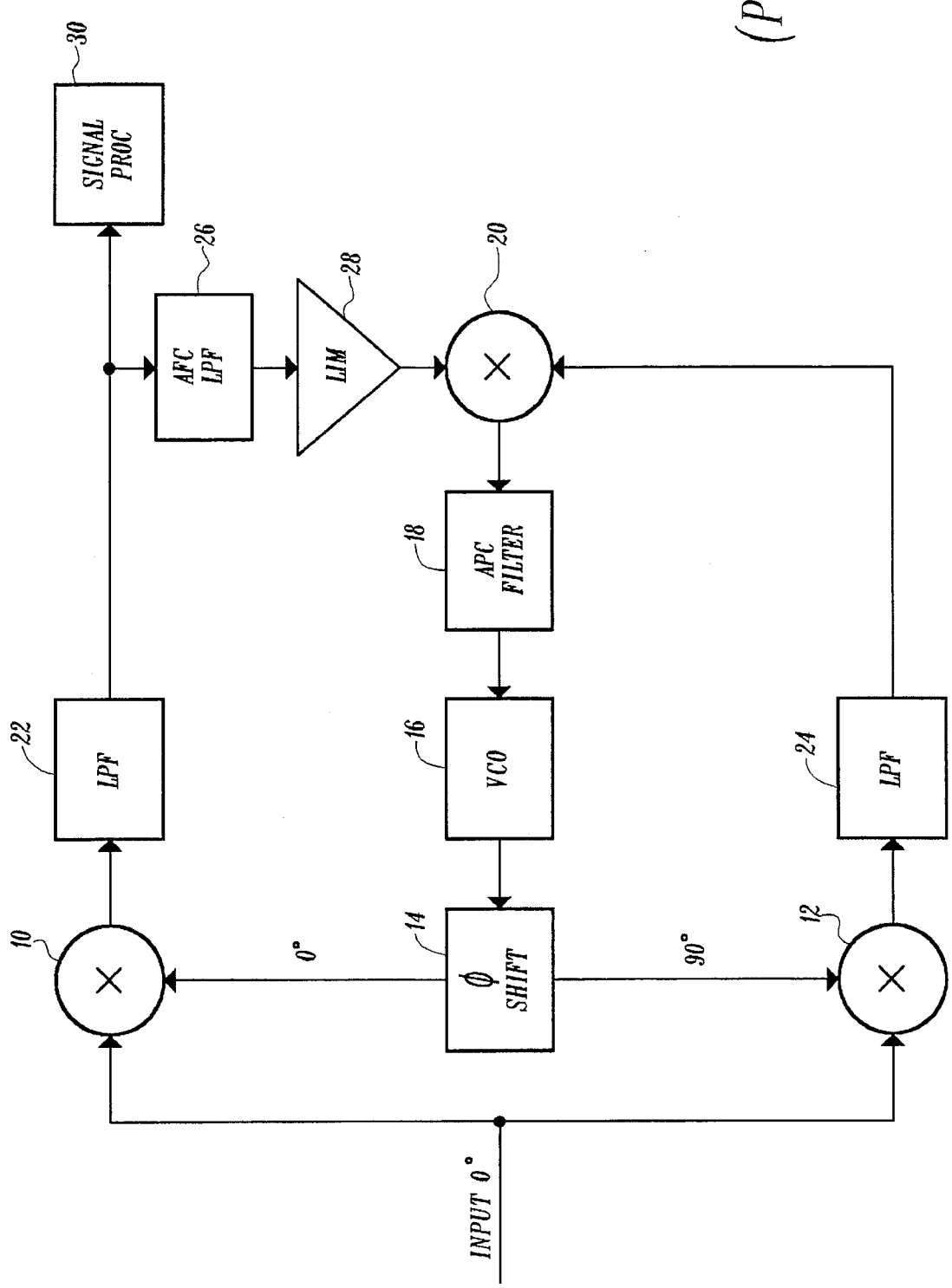
FIG. 1 is a simplified block diagram of a prior art FPLL demodulator.

Referring to the prior art FPLL of FIG. 1, a first multiplier 10 and a second multiplier 12 are supplied with a common input signal and with 90° phase shifted demodulation signals from a phase shifter 14. Phase shifter 14 is driven by a voltage controlled oscillator (VCO) 16 that in turn is driven from the output of an APC filter 18 that is supplied with the output of a third multiplier 20. Two low pass filters 22 and 24 are connected to the outputs of first and second multipliers 10 and 12, respectively. The low pass filter 22 supplies the demodulated signal to a signal processor 30 for further processing. The output of low pass filter 22 is also supplied to an AFC low pass filter 26. AFC Low pass filter 26 is coupled to a limiter 28, the output of which supplies one input of third multiplier 20. The other input of third multiplier 20 is supplied from low pass filter 24.

The prior art FPLL circuit functions to demodulate the incoming signal and supply it to the signal processor 30. As is well known, the upper portion of the block diagram generally comprises an automatic frequency control (AFC) loop and the lower portion comprises an automatic phase control (APC) loop. When frequency lock between the VCO signal and the incoming signal occurs, the polarity of the demodulated signal supplied to signal processor 30 may be positive or negative, depending upon the phase relationships between the input signal and the demodulating outputs of phase shifter 14. In the circuit of FIG. 1, there is no means shown for compensating for the biphase stability of the loop and therefore the demodulated output may be either polarity, i.e. positive going or negative going.

Figure 2:
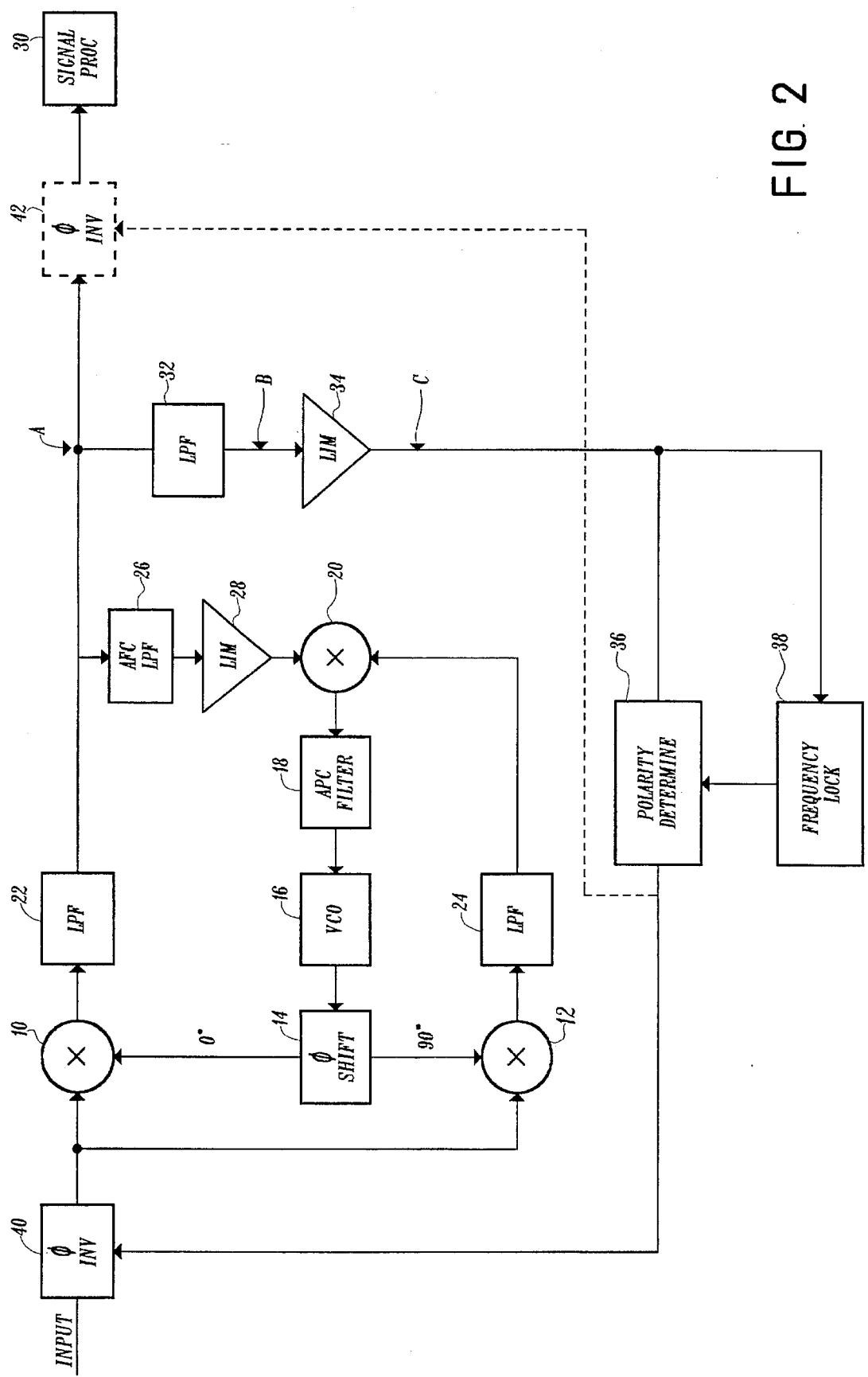
FIG. 2 is a block diagram of an FPLL demodulator incorporating the invention.

In the circuit of FIG. 2, the FPLL circuit of FIG. 1 is essentially duplicated and the common elements are indicated by the same reference numbers. The output of low pass filter 22 is also supplied, at a junction labelled A, to another low pass filter circuit 32 which has different characteristics (e.g. lower bandwidth) than AFC low pass filter 26. The output of low pass filter 32 is labelled B and is supplied to a limiter 34, the output of which is labelled C. Limiter 34 is coupled to a polarity determination circuit 36 and to a frequency lock circuit 38. Frequency lock circuit 38, in turn, is coupled to polarity determination circuit 36 and controls its operation. Polarity determination circuit 36 has a solid line connection to a phase inverter 40 that is inserted between the input signal terminal and the first and second multipliers 10 and 12. Polarity determination circuit 36 also has a dashed line connection to a (dashed line) phase inverter 42 that is inserted between low pass filter 22 and signal processor 30. It will be appreciated that only one of the dashed line and solid line versions of the circuit is implemented.

After FPLL lockup, the output of low pass filter 22 comprises a demodulated data signal and a DC offset voltage representing the pilot. This signal is applied to low pass filter 32 and limiter 34 which produce a DC voltage at the output of limiter 34 representative of the polarity of the pilot. The output of limiter 34, as will be seen in connection with FIGS. 4 and 5, may alternate above and below the zero carrier level prior to lock and attains a positive or negative level when frequency lock occurs, depending upon the lockup phase of the bistable FPLL. The polarity determination circuit 36 determines from the demodulated pilot signal level whether the input signal or the demodulated output signal should be phase inverted to supply a predetermined polarity signal to the signal processor 30. Depending upon the circuit implementation used, a feed forward or a feedback approach may be used for the inversion. In the solid line circuit including phase inverter 40, the feedback approach is used wherein the input signal is inverted when the polarity of the demodulated pilot signal indicates that the demodulated output signal will not have the predetermined polarity. On the other hand, the feed forward approach, indicated by the dashed line circuit including inverter 42 will accomplish the same result by inverting the polarity of the demodulated output signal before it is supplied to signal processor 30.

FIGS. 3, 4 and 5 represent waveforms of the signals present at points A, B and C, respectively, of the FPLL of FIG. 2 during reception of a digital 8-level VSB signal having a DC in-phase pilot component. The illustrations labelled Case (1) represent the condition of positive polarity FPLL lock, the illustrations labelled Case (2), the condition of negative polarity FPLL lock and the illustrations labelled Case 3, FPLL frequency unlock.

For Case 3 (frequency unlock), the signal at the data output of LPF 22 (FIG. 3) alternates above and below the zero carrier level with an average value of zero. This results in a sinusoidal beat signal at the output of LPF 32 (FIG. 4) corresponding to the frequency difference between the two signals applied to multiplier 10. A corresponding square wave signal is therefore generated at the output of limiter 34 (FIG. 5). The square wave signal at the output of limiter 34 indicates a frequency unlocked condition of the FPLL and is detected by frequency lock detector 38 for disabling polarity determination circuit 36.

Once frequency lock has been achieved, the demodulated data signal developed at the output of AFC LPF 26 will assume the form of Case (1) or Case (2) of FIG. 3. In Case (1) the average level of the data signal is greater than the zero carrier level and results in a positive DC voltage at the output of LPF 32 (FIG. 4). The output of limiter 34 (FIG. 5) is therefore a +1 signal which is detected by frequency lock detector 38 for enabling polarity determination circuit 36. Circuit 36, in turn, detects the +1 output of limiter 34 to determine that the FPLL has achieved positive polarity lock and generates an output control signal for application to inverter 40 or 42 maintaining the inverter in its present state.

For Case (2) of FIG. 3, the average level of the data signal at the output of LPF 22 is below the zero carrier level and therefore results in a negative DC voltage at the output of LPF 32 (FIG. 4). The output of limiter 34 (FIG. 5) is therefore a −1 signal which is also detected by frequency lock detector 38 for enabling polarity determination circuit 36. Circuit 36, in this case, detects the −1 output of limiter 34 to determine that the FPLL has achieved negative polarity lock and generates an output control signal for application to inverter 40 or 42 for changing the state of the inverter. That is, if the inverter was in its non-inverting state, it will be switched to its inverting state and vice versa.

What has been described is a novel FPLL circuit for a digital signal having a pilot. It is recognized that numerous changes in the described embodiment of the invention will be apparent to those skilled in the art without departing from its true spirit and scope. The invention is to be limited only as defined in the claims.

What is claimed is:

1. A method of demodulating a digital signal including an in-phase pilot, in the form of a DC offset voltage, comprising:

applying the digital signal to a biphase stable FPLL for demodulation;

recovering the DC pilot; and supplying an output demodulated signal of predetermined polarity as determined by the polarity of the recovered pilot.

2. The method of claim 1, further comprising:

determining the lockup phase of the FPLL from the polarity of the recovered pilot; and performing signal inversion, as indicated by the determining step, to assure the predetermined polarity of the output demodulated signal.

3. The method of claim 2 wherein the signal inversion is performed at the input of the FPLL.

4. The method of claim 2 wherein the signal inversion is performed at the output of the FPLL.

5. The method of claim 2, further comprising:

determining the existence of frequency lock of the FPLL from the recovered pilot; and delaying the polarity determining step until frequency lock has occurred.

6. The method of claim 5 wherein the recovered pilot is characterized by a positive or negative DC at frequency lock.

7. A circuit for receiving a digital signal including an in-phase pilot, in the form of a DC offset voltage, demodulating the digital signal, recovering the pilot and providing an output signal to a signal processor, comprising:

a biphase stable FPLL for receiving said digital signal and for recovering said pilot and generating a demodulated signal;

a biphase stable FPLL for receiving said digital signal and for recovering said pilot and generating a demodulated signal;

polarity determination means for determining from said recovered pilot, the polarity of said demodulated signal; and inverting means, responsive to said polarity determination means, for assuring that said output signal supplied to said signal processor has a predetermined polarity.

8. The circuit of claim 7 wherein said polarity determination means is coupled to the output of said FPLL and is responsive to the polarity of said recovered pilot signal.

9. The circuit of claim 8, further including;

frequency lock detection means, responsive to said recovered pilot, for delaying operation of said polarity determination means until the occurrence of frequency lock of said FPLL.

10. The circuit of claim 8 wherein said inverting means is coupled to the input of said FPLL.

11. The circuit of claim 8 wherein said inverting means is coupled to the output of said FPLL.

12. The circuit of claim 9 further including a low pass filter and a limiter coupled between the output of said FPLL and the input of said polarity determination means.

13. The circuit of claim 12, wherein said frequency lock detection means is coupled to the output of said FPLL through said low pass filter and said limiter.

14. The circuit of claim 9 wherein said recovered pilot is characterized by a positive or negative polarity DC when frequency lock has occurred.

* * * * *